United States Patent
Johnson et al.

(10) Patent No.: US 9,318,360 B2
(45) Date of Patent: Apr. 19, 2016

(54) LINEAR HIGH PACKING DENSITY FOR LED ARRAYS

(71) Applicant: Applied Materials, Inc., Santa Clara, CA (US)

(72) Inventors: Joseph Johnson, Redwood City, CA (US); Joseph M. Ranish, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 113 days.

(21) Appl. No.: 14/465,482

(22) Filed: Aug. 21, 2014

(65) Prior Publication Data
US 2015/0103526 A1 Apr. 16, 2015

Related U.S. Application Data

(60) Provisional application No. 61/989,736, filed on May 7, 2014, provisional application No. 61/889,736, filed on Oct. 11, 2013.

(51) Int. Cl.
*F21V 21/00* (2006.01)
*H01L 21/67* (2006.01)

(52) U.S. Cl.
CPC ................. *H01L 21/67115* (2013.01)

(58) Field of Classification Search
CPC ............. H01L 21/67115; H01L 21/67132; H01L 25/00; H01L 27/00
USPC ..................................... 362/249.06
See application file for complete search history.

(56) References Cited

U.S. PATENT DOCUMENTS

| 7,159,997 | B2 | 1/2007 | Reo et al. |
| 7,274,160 | B2 * | 9/2007 | Mueller ............ G09G 3/14 315/292 |
| 8,338,841 | B2 | 12/2012 | Lerman et al. |
| 8,579,467 | B1 | 11/2013 | Szeto |
| 2002/0005400 | A1 | 1/2002 | Gat |
| 2008/0179602 | A1 * | 7/2008 | Negley ............ H01L 21/2654 257/88 |
| 2009/0261743 | A1 * | 10/2009 | Chen ............ H05B 33/0827 315/192 |
| 2011/0069487 | A1 * | 3/2011 | Ng ............ H05B 33/0803 362/249.02 |
| 2011/0133658 | A1 * | 6/2011 | Sauerlaender ..... H05B 33/0824 315/192 |
| 2011/0267815 | A1 | 11/2011 | Ghiu et al. |
| 2013/0062634 | A1 | 3/2013 | Yu et al. |
| 2013/0094177 | A1 | 4/2013 | Edwards |

FOREIGN PATENT DOCUMENTS

JP    2002176000 A    6/2002

OTHER PUBLICATIONS

International Search Report and Written Opinion for International Application No. PCT/US2014/052349 dated Jan. 8, 2015.

* cited by examiner

*Primary Examiner* — Ali Alavi
(74) *Attorney, Agent, or Firm* — Patterson & Sheridan, LLP

(57) ABSTRACT

Apparatus for providing energy to a process chamber are provided herein. In one embodiment, the apparatus include a supporting substrate, a first plurality of solid state light sources disposed on a first surface of the supporting substrate, and a second plurality of solid state light sources disposed on the top surface of the supporting substrate, wherein the first and second plurality of solid state light sources are aligned and electrically isolated from each other, and the first plurality of solid state light sources is in physical contact with the second plurality of solid state light sources.

20 Claims, 6 Drawing Sheets

LINEAR HIGH PACKING DENSITY FOR LED ARRAYS

CROSS-REFERENCE TO RELATED APPLICATIONS

This application claims benefit of U.S. provisional patent application Ser. No. 61/889,736, filed Oct. 11, 2013, and 61/989,736, filed May 7, 2014, which are herein incorporated by reference.

FIELD

Embodiments of the present disclosure generally relate to semiconductor processing systems and, more specifically, to solid state light sources for use in semiconductor processing systems.

BACKGROUND

Several applications that involve the thermal processing of substrates such as semiconductor wafers and other materials involve the process steps of rapidly heating and cooling a substrate. Examples of such processing include rapid thermal processing (RTP), physical vapor deposition (PVD) processing, and the like, which are used for a number of semiconductor fabrication processes.

During semiconductor fabrication processing, heat energy from lamps is radiated into the process chamber and onto a semiconductor substrate in the processing chamber. In this manner, the substrate is heated to a required processing temperature. Typically, the use of conventional lamps (tungsten halogen, mercury vapor, arc discharge) or electrical heating elements has been the dominant approach to delivering energy to the substrate for dopant annealing, film deposition, or film modification. These processes are often thermally based and typically require high process temperatures ranging from 200° C. to 1600° C., which can result in significant thermal budget issues that adversely affect device performance. In addition, the use of conventional lamps has associated high maintenance costs with respect to operating lifetime, material and energy usage. Conventional lamps emit radiation over a broad spectrum of wavelengths which can be detrimental to some instrumentation and/or result in an unintended response in the target substrate/film from the undesired wavelengths.

Arrays of solid state light sources, for example Light Emitting Diodes (LEDs), may be used instead of, or in addition to, conventional lamps for various semiconductor fabrication processes to address some of the foregoing issues. In order to achieve target irradiance levels on the order of $1 \times 10^6$ W/m² that are comparable to the intensities required for RTP, high packing density of LEDs would need to be used. However, electrical standards call for a minimum spacing requirement between conductors of different voltages to prevent electrical leakage and breakdown on a circuit board. This limits the configuration of LEDs for high voltage operation since the LEDs cannot be spaced too closely.

Therefore, there is a need in the art to provide an improved high density solid state light source array for use in semiconductor processing systems.

SUMMARY

Embodiments of the disclosure provide a solid state light source in a higher packing density. In one embodiment, the apparatus includes a supporting substrate, a first plurality of solid state light sources disposed on a top surface of the supporting substrate, and a second plurality of solid state light sources disposed on the top surface of the supporting substrate, wherein the first and second plurality of solid state light sources are aligned and electrically isolated from each other, and the first plurality of solid state light sources is in physical contact with the second plurality of solid state light sources.

In another embodiment, the apparatus includes a supporting substrate, a first plurality of solid state light sources disposed on a first surface of the supporting substrate, and a second plurality of solid state light sources disposed on the first surface of the supporting substrate, wherein the first and second plurality of solid state light sources are electrically isolated from each other, and the first and second plurality of solid state light sources are aligned and separated from each other by a distance of about 0.001 mm to about 1 mm.

In yet another embodiment, an apparatus for providing energy to a process chamber is provided. The apparatus includes a supporting substrate and at least 20 strings of solid state light sources disposed parallel to each other on a first surface of the supporting substrate, wherein each string of solid state light source is in a straight line configuration and has at least 20 light emitting elements electrically coupled in series, and wherein each string of solid light source and the immediate adjacent string of solid light source are electrically isolated and separated from each other by a distance of about 0.001 mm to about 1 mm.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
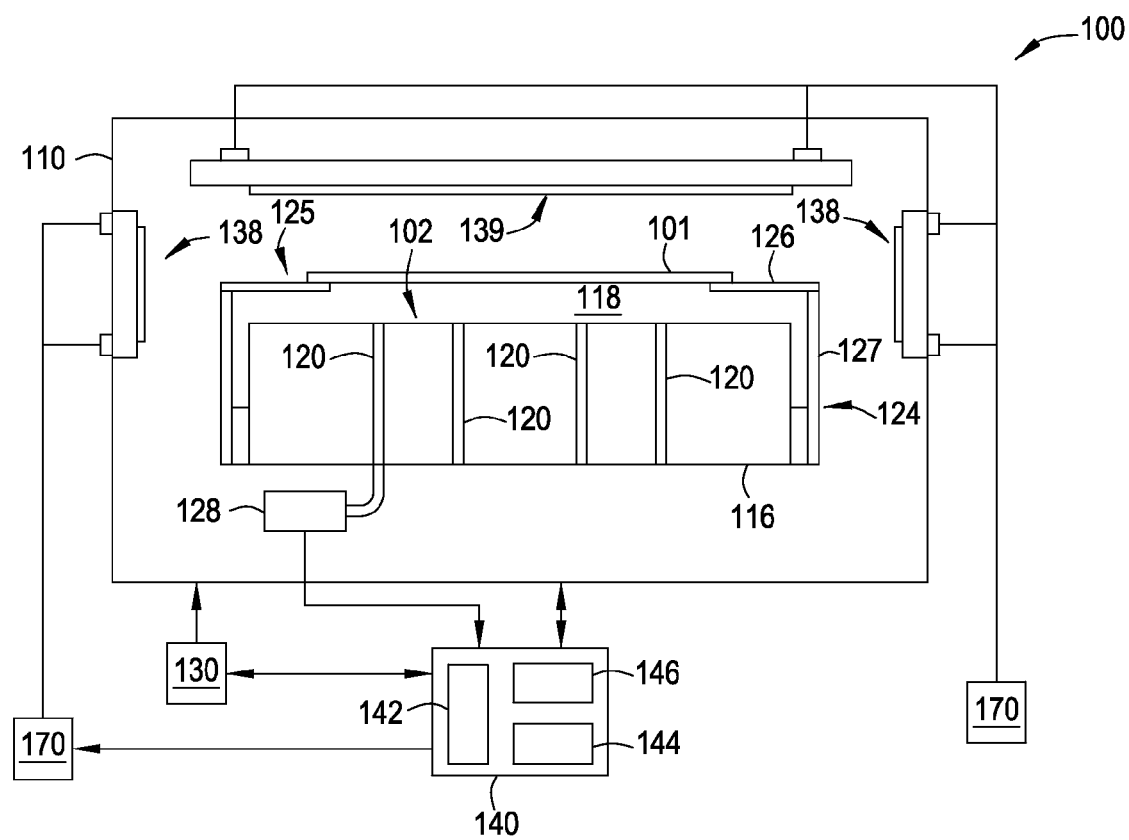
FIG. 1 is a schematic, cross-sectional view of a semiconductor substrate process chamber in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the disclosure provide a solid state light source in a higher packing density. The inventive solid light source may advantageously provide improved heating of substrates and other components disposed in a process chamber. In the following description, the term substrate is intended to broadly cover any object that is being processed in a chamber, such as thermal process chambers, degas chambers, load lock chambers etc. The term substrate may include, for example, semiconductor wafers, flat panel displays, glass plates or disks, plastic workpieces, and the like. In the following description solid state light point sources include light emitting diodes (LEDs) and LASERs. In addition, although described below in terms of LEDs or arrays of LEDs, LASERs and arrays of LASERs, or other solid state light point sources may be used interchangeably in embodiments described herein.

Exemplary Chamber Hardware

FIG. 1 depicts a schematic of an exemplary process chamber 100 configured to perform thermal processes, such as a rapid thermal process (RTP), and suitable for use with the inventive LED source for heating substrates in accordance with some embodiments of the present disclosure. The process chamber 100 may be any type of process chamber having a substrate support configured to support a substrate (e.g., process chamber that includes a substrate support ring, a susceptor which holds the substrate in multiple places, air jets that holds the substrate in place) and optionally having a reflector plate located along a back side of the substrate. Examples of suitable process chambers includes any of the RADIANCE®, RADIANCE® PLUS, or VANTAGE® process chambers, or any other process chamber capable of performing a thermal process, for example RTP, all available from Applied Materials, Inc., of Santa Clara, Calif. Other suitable process chambers, including those available from other manufacturers may also be used and/or modified in accordance with the teachings provided herein. For example, other suitable process chambers that may utilize the inventive LED source for heating substrates described herein include Physical Vapor Deposition (PVD) chambers, Chemical Vapor Deposition (CVD) chambers, Epitaxial Deposition chambers, etch chambers, Atomic Layer Deposition (ALD) chambers, etc.

The process chamber 100 may, for example, be adapted for performing thermal processes and illustratively comprises a chamber body 110, support systems 130, and a controller 140 that includes of a CPU 142, memory 144, and support circuits 146. The process chamber 100 depicted in FIG. 1 is illustrative only and other process chambers, including those configured for processes other than RTP, may be modified in accordance with the teachings provided herein.

The process chamber 100 includes a first energy source 139 and a second energy source 138, each of which may include a plurality of light-emitting diodes (LEDs) or array(s) of LEDs arranged in zones, wherein each zone of LEDs is separately controllable. In some embodiments, each energy source 138, 139 may be a conventional lamp augmented with LEDs strewn about areas of the lamp head that had previously not been a light-emitting surface, increasing usage of the heat source surface area.

In FIG. 1, the first energy source 139 is shown above the substrate 101 for heating an upper surface of the substrate 101, and a second energy source 138 is shown near each side of the substrate 101 (which may be used, for example, to heat edge ring 126 which contacts the substrate 101). Alternatively, the second energy source may be configured to heat the back side of the substrate 101, for example, such as by being disposed below the substrate 101, or by directing the radiation to the back side of the substrate 101. Each energy source 138, 139 is coupled to one or more power sources 170 which may be coupled to controller 140 to separately control each energy source 138, 139. The temperatures at localized regions of the substrate 101 are measured by a plurality of temperature probe assemblies 120 that pass through a through hole that extends from the back side of the base 116 to the top of a reflector plate 102. However, since the monochromatic properties of LEDs will not cause pyrometer interference, in some embodiments, temperature measurements may advantageously be obtained via pyrometers disposed anywhere in the chamber. It should be contemplated that the LEDs may be placed on a robot that moves the substrate from one place to another.

The temperature probe assemblies 120 transmit sampled light from the reflecting cavity 118 to a pyrometer 128. The pyrometer 128 is connected to controller 140 which controls the power supplied to each energy source 138, 139, in response to a measured temperature. Each energy source 138, 139 may be divided into multiple zones. The zones can be individually adjusted by the controller to allow controlled radiative heating of different areas of the substrate 101. In other embodiments, each light (LED or conventional light source) in each energy source 138, 139 may be separately controlled to facilitate even finer control of the radiative heating.

In some embodiments, a cooling mechanism may be used to cool each energy source 138, 139. Some exemplary cooling mechanisms may include, for example, the use of heat sinks coupled to or grown on (as discussed below) a backside of each energy source 138, 139. In some embodiments, the substrate on which the light sources are mounted or grown on may itself be a heat sink used for cooling. In other embodiments, each energy source 138, 139 may be cooled by a gas or liquid circulated around or proximate to the energy source.

A substrate support 124 included in chamber 100 may include parts of a process kit 125 which may be adapted to work with various embodiments of substrate supports and/or process chambers. For example, the process kit 125 may include elements of the substrate support 124, such as edge ring 126 and an edge ring support 127.

During processing, the substrate 101 is disposed on the substrate support 124. Each energy source 138, 139 is a source of radiation (e.g., heat) and, in operation, generates a pre-determined temperature distribution across the substrate 101. Each energy source 138, 139 may provide energy in wavelengths ranging from ultraviolet wavelengths to infrared wavelengths (e.g., about 100 nanometers (nm) to about 2000 nanometers (nm)). In some embodiments each energy source 138, 139 may provide energy in the microwave wavelength range. The energy sources 138, 139 provide radiation that is absorbed by the substrate 101. Although some of the radiation produced by an LED source may be reflected, substantially all of the radiation that is not reflected is absorbed by the target component being heated. In embodiments described herein, the substrate 101 may bow, for example up to about 5 mm, during heating. Thus, in some embodiments, the energy sources 138, 139 should be placed just far enough away to avoid contact if the substrate 101 bows, but close enough to provide the necessary uniform heat energy to the target substrate. In some embodiments, the energy sources 138, 139 may be bowed or shaped to compensate for the target substrate deformation.

In the exemplary processing chamber 100 described above, the energy sources 138, 139 may be used to illuminate and heat the surface of a substrate to process the near surface region of the substrate. LED light sources offer a variety of advantages including higher efficiency and more rapid response times. Pulse widths are selectable and can range to less than a millisecond to more than a second.

In some embodiments, the energy sources 138, 139 may be used in conjunction with processing chambers to form films, treat dopants, change process gases (e.g., break bonds), and reorder the substrate itself. Additional high temperature substrate processing may benefit from LED heating as even higher output intensities become available. LEDs offer advantages when used to process the near surface region of a substrate. LEDs last a long time and allow the output intensity to be chosen independent from the wavelength(s) of the output illumination. LEDs may consist of gallium nitride, aluminum nitride, combinations thereof or other III-V materials grown on a substrate constructed to emit light close to one or more wavelengths determined by the bandgap of III-V materials in the active region. A phosphor may also be used to convert an emitted wavelength to a longer wavelength, reducing the energy of an emitted wavelength. It will be understood that the solid state sources described herein and depicted in the remaining figures may employ a phosphor in order to enhance absorption or enhance a chemical reaction.

Depending on the chemistries involved, illuminating a surface in the presence of gas precursor can enhance the rate of chemical reactions by thermal or other means. For example, the light may excite gas phase molecules, adsorbed molecules, or even electronically excite the substrate to promote a chemical reaction on the surface. The wavelength of the LED may be selected to promote desirable film processes by, for example, choosing a wavelength which is resonant with a molecular electronic transition in order to enhance a reaction rate. The wavelength may also be chosen to enhance absorption of the radiation by the substrate, thereby heating the substrate more efficiently.

In some embodiments, each energy source 138, 139 in FIG. 1 may include one large array of LEDs. However, depending on the heat energy and area to be heated, one large array of LEDs may require more power than can safely be provided without damage to the LEDs and associated circuitry. The inventors have observed that by modularizing LEDs into a plurality of smaller LED arrays, the smaller LED arrays can be more easily handled, manufactured, and powered. In addition, a plurality of smaller arrays of LEDs may also help in the event of LED failure. For example, in some embodiments, if one LED fails and becomes an open circuit, then only the heat emitted from the small LED array is lost. If one large array of LEDs is used, then one LED failure may cause all processing to stop. In some embodiments, each of the plurality of smaller LED arrays can have different modules with different wavelengths. In some embodiments, each LED array can be removed and replaced with another LED array with different wavelengths.

Exemplary LED Arrays

Figure 2A:
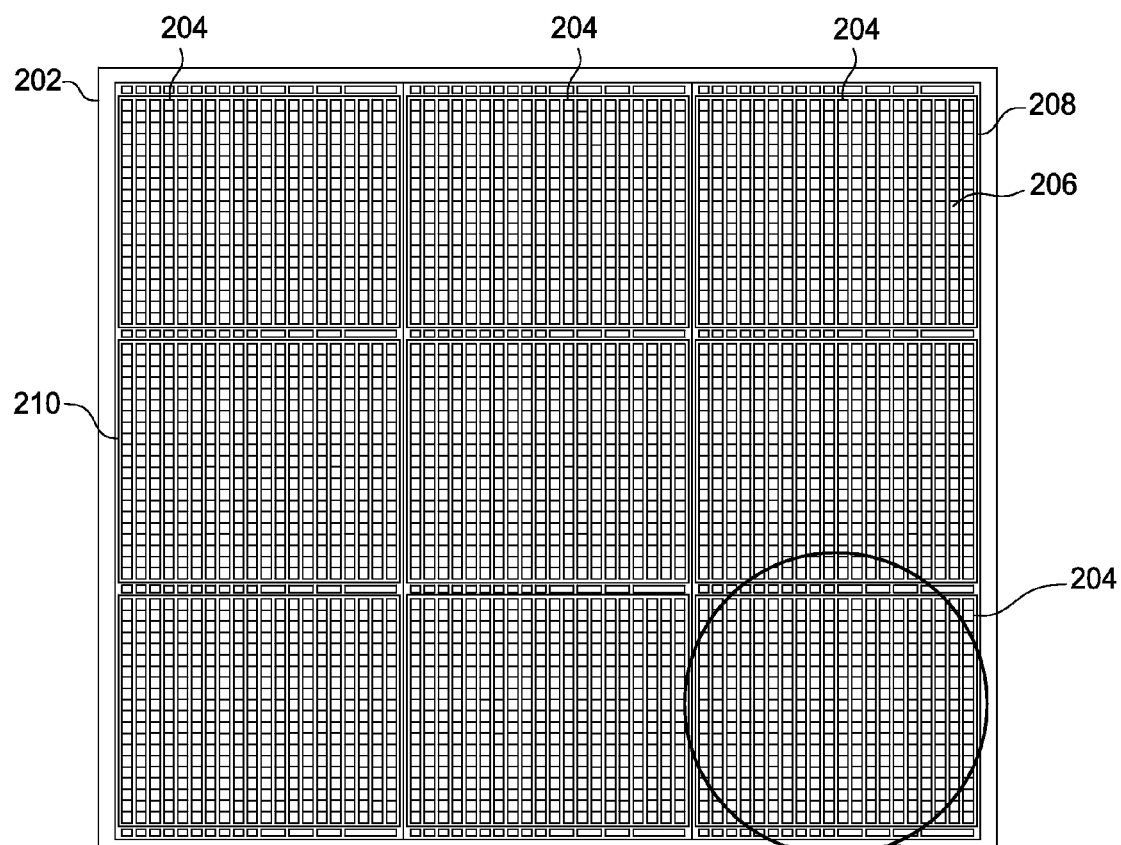
FIG. 2A is a schematic top view of a solid state light source that includes a plurality of LED arrays in accordance with some embodiments of the present disclosure.

FIG. 2A shows an exemplary embodiment of a first energy source 139 that includes a plurality of LED arrays 204 disposed on a LED substrate 202 for thermally processing other substrates and/or heating various processing chamber components disposed in the processing chamber. In some embodiments, the first energy source 139 may illustratively be between 100 mm and 480 mm in length and between 100 mm and 480 mm in width. It is contemplated that various size energy sources 139 may be used as required or desired in any particular application. In some embodiments, each LED array 204 may be about 10 mm to about 40 mm in width and about 30 mm to about 60 mm in length. In one example, the LED array 204 is about 20 mm in width and about 50 mm in length; although other size LED arrays 204 may be used. Each LED array 204 may contain between about 300 and about 800 LEDs (or dies) 206. LEDs 206 may be spaced between about 0.2 mm and about 1 mm apart. LED arrays 204 may be spaced between about 0.5 mm and about 4 mm apart.

Figure 2B:
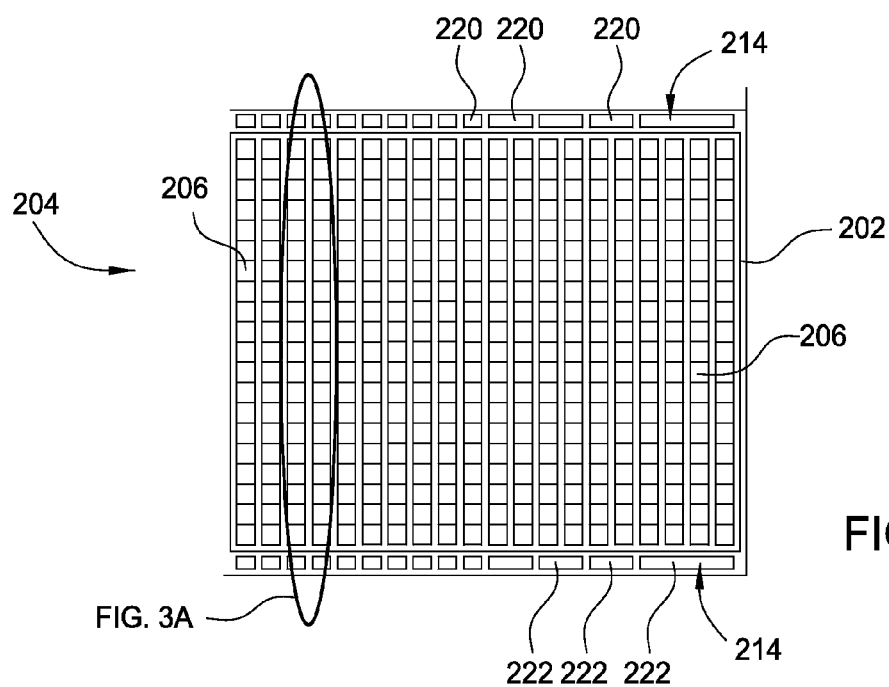
FIG. 2B is an enlarged view of a region "FIG. 2B" of FIG. 2A.

Each of the plurality of LED arrays 204 includes a plurality of LEDs 206. For example, in some embodiments, at least one of the plurality of LED arrays 204 may include 400 LEDs as shown in FIG. 2B. Each LED 206 in LED arrays 204 may emit light and heat energy from one or more exposed surfaces. In some embodiments, all exposed surfaces of each LED 206 may emit light and heat energy. In some embodiments, each LED may be about 0.5 mm by about 0.5 mm square and about 0.3 mm in height, although other size LED 206 may be used. LEDs 206 may emit wavelengths in the Ultra Violet (UV) (200-400 nm), visible light (400-700 nm) or near infrared (700-1000 nm) wavelength ranges. In some embodiments that require high intensity output, the optical output of LEDs 204 are on the order of 1 W/mm$^2$ or greater, which corresponds to a target irradiance of $1 \times 10^6$ W/m$^2$ with sufficiently high packing densities. With sufficiently high packing densities of LEDs 206 over a given area, the LED arrays 204 advantageously provide the ability to achieve rapid thermal processing. In addition, LEDs can also be operated at a lower intensity as needed for other processes that do not require high power. The wide range of available wavelengths for LEDs advantageously enable wavelength specific, high intensity sources for industrial applications. Multi-wavelength capability can be realized in a single LED array 204 or across multiple LED arrays 204 in a system.

LEDs 206 and LED arrays 204 have faster on-off switching times than incandescent lamps. In some embodiments, the LEDs have on-off switching times on the order of microseconds versus hundreds for milliseconds for incandescent lamps. In some embodiments, the LEDs have a switch-on time from about 0.5 nanoseconds to about 10 nanoseconds and a switch-off time from about 0.5 nanoseconds to about 10 nanoseconds. Faster on-off switching times enables shorter thermal exposures. The use of small form factor LEDs as described above makes it possible to design conformal high intensity illumination systems at a lower cost of ownership, longer operating lifetime (~100k hours) and in the case of UV LEDs, an environmentally sensitive alternative to toxic mercury vapor based lamps.

In some embodiments, the LED array 204 can be individual LED chips 206 with different wavelengths, or the LED array 204 can be a collection of LED lamps with different wavelengths. The LEDs can be multiplexed/rasterized such that certain LEDs with certain wavelengths are activated at one time. For example, at time 1t, only λ1 LEDs are active, at time 2t only λ2 LEDs are active, etc. Thus, the LEDs in LED array 204 can be grouped and separately controlled by a controller (e.g., controller 140).

In some embodiments, each LED 206 may be individually mounted on LED substrate 202. Each LED 206 may be mounted to the substrate via eutectic bonding, including wirebond-free direct attach LEDs. To direct attach LEDs to a substrate, a flux may be first disposed on the substrate surface to which the LEDs will be attached. The LEDs are then disposed over this surface. The LEDs and the surface are then heated with a certain heating profile. An amount of solder disposed on the bottom of the LED will melt with help of the flux, and will attach the LED to the fluxed surface. In some embodiments, each LED 206 may be grown on LED substrate 202. The LEDs 206 may be individually grown, grown in groups/sections, or grown all together at the same time. In some embodiments, the LED substrate 202 that LED arrays 204 are mounted to, grown on, or built on, may be an n-type substrate 202, with an electrode (i.e., electrical contact terminals 214) attached to the p-type layer deposited on its surface. Silicon substrates or sapphire substrates may be used as well. The substrate can be any material that is thin enough, or has a high thermal conductivity, such that it is able to dissipate heat from the LEDs quickly while also providing electrical isolation of the LEDs from the rest of the system. In some embodiments, this can be done by using an electrically isolating material or by using a dielectric layer. LEDs can be grown on any material where the lattice structure of the substrate can be made to match the lattice structure of the LED material through, but not limited to, direct deposition, application of a buffer layer, and/or any type of stress relaxation. In some exemplary embodiments, the substrate can be ceramic or metal. For example, in some embodiments, a copper substrate may be used to mount the LEDs on, which is then eutectically bonded to a larger copper heat sink. In some embodiments, islands of non-substrate material/chemistries may be grown or included in the substrate to help facilitate LED growth.

FIG. 2B is an enlarged view of a region "FIG. 2B" of FIG. 2A showing more details of the LED array 204. As can be seen, the LED substrate 202 may have multiple electrical contact pads 214 disposed on a top surface (or a packaging surface) of the LED substrate 202 to supply power from a power source (not shown) to the LED array 204. Each of the electrical contact pads 214 includes a positive terminal (collectively designed as 220) and a negative terminal (collectively designed as 222). In this disclosure, the negative terminal may refer to a ground terminal or a terminal with a reference potential that is different than the positive terminal. The positive terminals and negative terminals may be arranged in a manner so that any generated parasitic inversion is minimized or accommodated by a proper gap without affecting the packing density obtained according to embodiments of the disclosure. In some embodiments, the positive terminal 220 and negative terminal 222 may be arranged at a peripheral region of each LED array 204 on opposing sides of a diameter of the LED array 204. The electrical contact pads 214 may each be configured with various lengths to provide power required for a single or multiple strings of the LEDs 206. For example in one embodiment shown in FIG. 3A, two or four strings of LEDs 206 may share one common electrical contact pad 214.

While the electrical contact pads 214 is shown to dispose on the top surface of the LED substrate 202, some or all of the electrical contact pads 214 may be disposed on the back surface of the LED substrate 202 (i.e., the non-packaging surface opposing and in parallel to the packaging surface of the LED substrate) to provide more space on the top surface for the LEDs 206. In such a case, one or more contact vias (not shown) may be formed through the LED substrate 202 at the peripheral region of each LED array 204 so that a single or multiple strings of the LEDs 206 are electrically connected to the electrical contact pads on the back surface of the LED substrate 202 through the contact vias.

In some embodiments, the electrical contact pads 214 may contact terminals on the LED substrate 202 which are coupled to a power source to provide power to the plurality of LED arrays 204. Some embodiments may have electrical contacts that directly connect to the LED terminals and not through the substrate. In other embodiments, internal wires beneath the surface of the LED substrate 202 may connect all the LEDs and then bring all the connections to a surface terminal away from the LEDs.

Referring back to FIG. 2A, each LED array 204 may optionally include a reflector 208 disposed on one or more sides of the LED array 204. In some embodiments, some or all of the LEDs 206 in LED array 204 may include a reflector 210 disposed on one or more sides of the LED 206. The reflectors 208, 210 are configured to reflect the light and heat energy emitted from the LED towards the desired target (e.g., wafer substrate, or other process chamber component, etc.). In the case of LASERS, the reflectors 208, 210 could direct the light off of the LASER beams' axis to heat a wafer substrate or desired process chamber component. The reflectors 208 and 210 may be angled to reflect radiated LED light in a desired direction. In some embodiments, the angles of the incline of the reflector surfaces from the LED substrate 202 surface is between about 45 to 55 degrees from an axis of the LED extending in a direction toward where light energy is desired (e.g., for a planar array of LEDs, the axis may be perpendicular to the planar array), however, any angle which maximizes the angle and desired length of the reflector based on the space available between two neighboring LEDs 206, or LED arrays 204, may be used. In other embodiments, the surfaces of the reflectors 208, 210 may be perpendicular to the surface of the LED substrate 202. Still, in other embodiments, the surface of the LEDs 206 may be angled instead of, or in addition to, the surface of the reflector. In some embodiments, the height of the reflectors 208, 210 is at least the same height as the height of the LEDs 206, but may be higher or lower than the LEDs 206 as required. Further details regarding the reflectors can be found in commonly owned U.S. Provisional Patent Application 61/714,963, filed on Oct. 17, 2012 and incorporated herein by reference in its entirety without affecting the scope of the present disclosure.

Exemplary LED array configurations consistent with the description above with respect to FIGS. 2A and 2B is described below in further detail with respect to FIGS. 3A and 4.

Figure 3A:
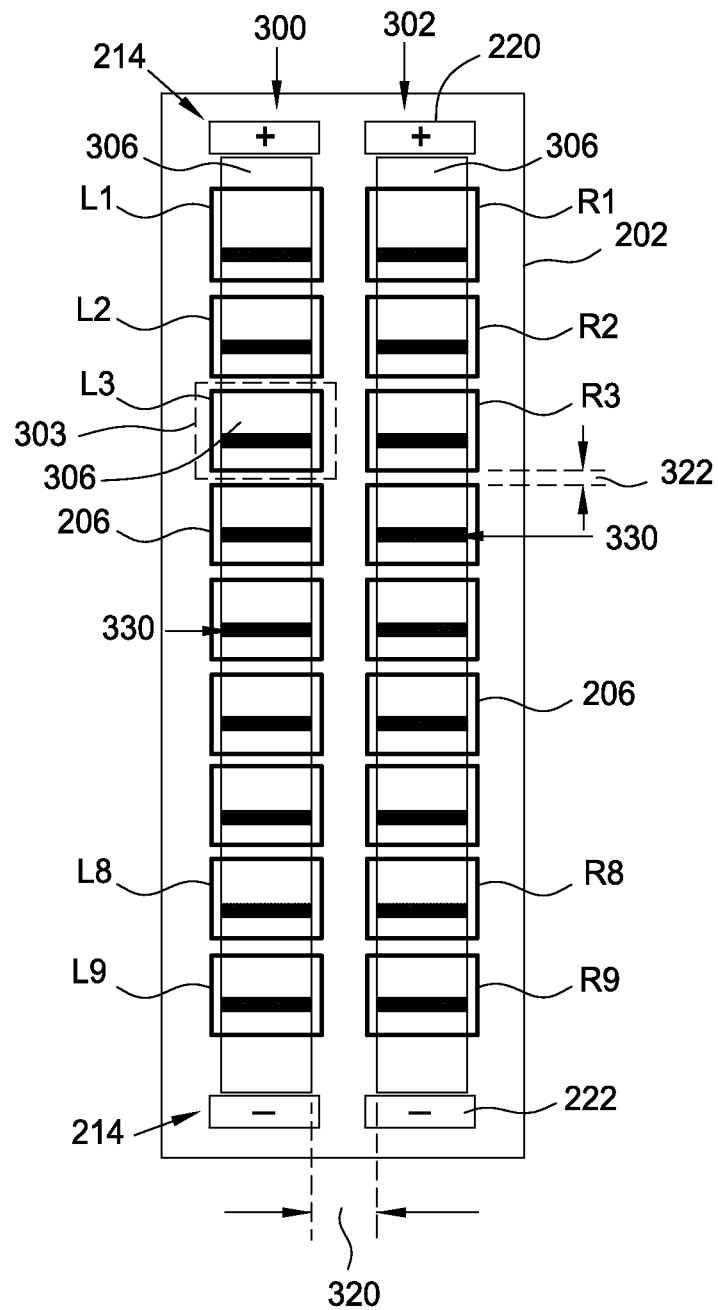
FIG. 3A is an enlarged view of a region "FIG. 3A" of FIG. 2B showing exemplary embodiments of an LED array.

FIG. 3A is an enlarged view of a region "FIG. 3A" of FIG. 2B showing exemplary embodiments of an LED array where LEDs 206 are arranged in parallel linear or straight lines. For sake of clarity, the embodiment shown in FIG. 3A contains nine LEDs 206 in each LED string. It is contemplated that any number of LEDs may be placed in a string as long as the power source can supply voltage required for the LED string. In general, a plurality of LEDs 206 are electrically and mechanically coupled to the top surface (or the packaging surface) of the LED substrate 202 in a manner as discussed previously, with the plurality of LEDs 206 being electrically connected in series between the positive terminal 220 and the negative (or ground) terminal 222 of the electrical contact pad 214 on the packaging surface (or the back surface in some embodiments) of the LED substrate 202. The positive terminal to which the first LED string 300 is connected may have the same or different electric potential as the positive terminal to which the second LED string 302 is connected. Similarly, the negative terminal to which the first LED string 300 is connected may have the same or different electric potential as the negative terminal to which the second LED string 302 is connected. The negative terminal described herein may refer to a ground terminal or a terminal with a reference potential that is different than that of the positive terminal.

In some embodiments, the plurality of LEDs 206 may be arranged in a straight line configuration and electrically coupled in series between the positive terminal 220 and the negative terminal 222. In one example, the plurality of LEDs 206 is arranged in multiple straight lines parallel to one another between the positive and negative terminals 220, 222. In the example shown in FIG. 3A, the LEDs 206 are arranged in a first LED string 300 and a second LED string 302 parallel to the first LED string 300. In some embodiments, the first LED string 300 and the second LED string 302 are electrically isolated from each other.

Each LED unit 303 in the first LED string 300 may include a LED portion 206 and a metal pad 306. When LEDs 206 are connected in series, the cathode electrode (not shown) of the first LED 206 (labeled as "L1") in the first LED string 300 connects to the anode electrode (not shown) of the second LED 206 (labeled as "L2") in the first LED string 300, and the cathode electrode (not shown) of the second LED 206 (L2) connects to the anode electrode (not shown) of the third LED 206 (labeled as "L3") and so on. LEDs 206 in the second LED string 302 are connected in the same approach. Each LED unit 303 may be connected to another LED unit 303 via the metal pads 306. Each metal pad 306 may be separated electrically from adjacent metal pads 306 using, for example, a dielectric separator 330. A first end of the LED units 303 connected in series may include a power source wire contact pad, which serves as a positive terminal 220, configured to receive power from a power source (not shown) to power the LED units 303. A second end of the LED units 303 connected in series may include a ground wire contact pad, which serves as a negative (or ground) terminal 222, to complete the electrical circuit and ground the LED string 300. Similar configurations are applied to the second LED string 302. In some embodiments, the electrical contact pads (i.e., the positive and negative terminals) may be disposed on a back surface of the LED substrate 202 as discussed previously. While metal pad are shown and discussed, the LED units may be connected through wire bonds or any other suitable connection approaches electrically equivalent to the metal pad.

In some embodiments, each LED 206 may be about 0.25 mm to about 15 mm in length and about 0.25 mm to about 15 mm in width. The first LED string 300 and the second LED string 302 may be separated from each other by a distance 320 of about 0.001 mm to about 1 mm, for example about 0.2 mm to about 0.4 mm. This distance is limited by the pick-and-place technique of the machines assembling the boards. In some embodiments, the distance 322 between LEDs in the same LED string 300 or 302 may be about 0.01 mm to about 0.4 mm, for example about 0.03 mm to about 0.06 mm. Since the first LED string 300 and the second LED string 302 are electrically isolated from each other, the distance 322 can be 0 mm (i.e., the first LED string 300 is in physical contact with the second LED string 302) without any adverse effects to the operation of the device. Without being bound by any particular theory, in some embodiments the distance 320 may be 0 mm due to the zero voltage difference between two adjacent LED strings. The distance 320 can be decreased or increased in accordance with the standard rule required by the PCB industry to minimize a current leakage between the first LED string 300 and the second LED string 302. The standard rule for a pair of parallel conductors where one conductor is powered at 40 volts and the other conductor is powered at 0 volts may need to be spaced at about 0.0254 mm, which can be proportionally increased or decreased in light of the conductor material and the voltage applied to the conductors. For example, a pair of parallel copper conductors which exhibit a 500 volt difference may need to be spaced at about 0.3175 mm to prevent current leakage across the conductors.

In various embodiments, the packing efficiency (or fill factor) may be about 60% to about 100% of the total surface area of the LED substrate 202. In one example, there may be about 118 LEDs per square centimeter of the LED substrate.

Having the LEDs 206 in each LED array 204 arranged in parallel strings of straight lines is advantageous because there is zero voltage difference between the two adjacent LED strings (e.g., first and second LED strings 300, 302) if both strings are powered at the same voltage. If there are nine LEDs 206 in the first and second LED strings 300, 302 with each LED 206 having a constant voltage drop of 3 volts, the first and second LED strings 300, 302 will require 27 volts, respectively. Therefore, the cathode electrode at the first LED 206 ("L1") in the first LED string 300 and the cathode electrode at the first LED 206 (labeled as "R1") in the second LED string 302 will be at the same voltage rating of 27 volts, while the anode electrode at the second LED 206 ("L2") in the first LED string 300 and the anode electrode at the second LED 206 (labeled as "R2") in the second LED string 302 will be at the same voltage rating of 24 volts. Similarly, the anode electrode at the eighth LED 206 (labeled as "L8") in the first LED string 300 and the anode electrode at the eight LED 206 (labeled as "R8") in the second LED string 302 will be at the same voltage rating of 6 volts, while the cathode electrode at the ninth LED 206 (labeled as "L9") in the first LED string 300 and the cathode electrode at the ninth LED 206 (labeled as "R9") in the second LED string 302 will be at the same voltage rating of 3 volts. Since the voltage drops in each LED string are equal, there would be zero voltage potential difference between two adjacent parallel LED strings 300, 302. Therefore, the first LED string 300 and second LED string 302 can be placed exactly next to each other with a minimum spacing required by the PCB industry mentioned above (which in this case, is technically 0 mm distance between the first and second LED strings 300, 302). As a result, the LEDs 206 can be packed as closely as possible to obtain high packing density of the LED arrays 204, without current leakage problems due to zero voltage difference across two immediately adjacent LED strings.

In some embodiments, the LED arrays may have unequal number of diodes per LED string. While the LED strings are shown in FIGS. 2 and 3A as linear array (e.g., straight line) configuration, the inventive concept is applicable to LED strings having a different arrangement for any desired irradiance so long as the power source can supply voltage required for the LED strings, and the voltage difference between two adjacent LED strings does not cause arcing faults. For example, the LED strings may be arranged in a curve, circular, or serpentine configuration on the top surface (or the packaging surface) of the LED substrate 202 in a manner as discussed above with respect to FIGS. 2A-2B and 3A, although the packing density of such arrangement may not be as high as for straight line configuration.

Figure 3B:
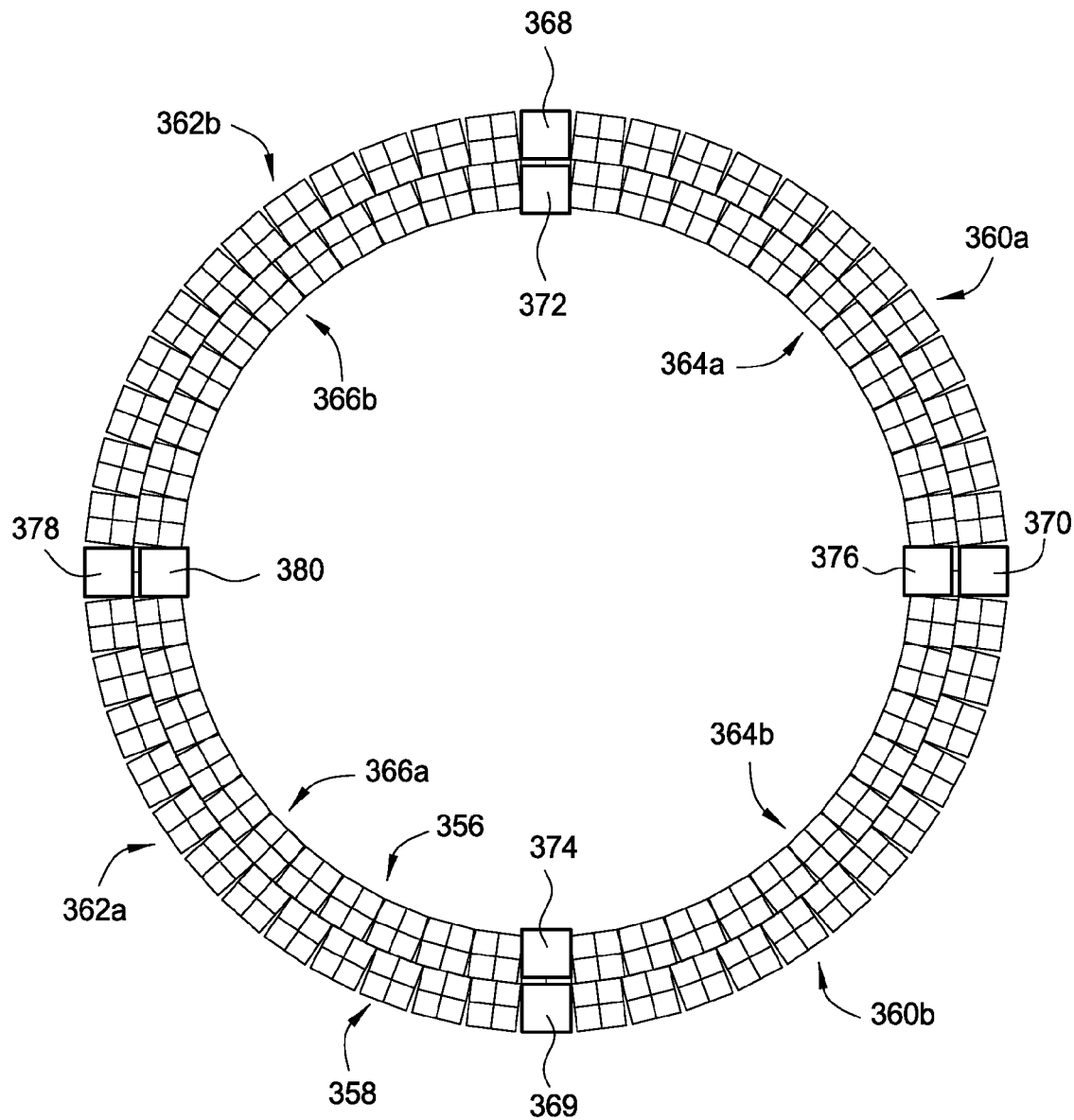
FIG. 3B is an exemplary arrangement of the LED strings according to embodiments of the disclosure.

FIG. 3B illustrates an exemplary arrangement of the LED strings according to embodiments of the disclosure. In this embodiment, a plurality of LED strings, similar to LED strings 300, 302 shown in FIG. 3A, is arranged in multiple concentric rings of increasing diameter on the top surface (or the packaging surface) of the LED substrate 202. For example, eight LED strings 360a,b, 362a,b, 364a,b, and 366a,b may be arranged in two concentric rings 356, 358, with four LED strings being arranged in each ring, as shown in FIG. 3B. The LED strings 360a, 360b, 362a, 362b in the outer ring 356 have more LEDs than that of the LED strings 364a, 364b, 366a, 366b arranged in the inner ring 358. In some embodiments, the LED strings 360a, 360b, 362a, 362b in the outer ring 356 may be in physical contact with the LEDs strings 364a, 364b, 366a, 366b arranged in the inner ring 358. In such a case, the LED strings 360a, 360b, 362a, 362b in the outer ring 356 may be electrically isolated from the LEDs strings 364a, 364b, 366a, 366b in the inner ring 358. In some embodiments, the LED strings 360a, 360b, 362a, 362b in the outer ring 356 may be separated from the LEDs strings 364a, 364b, 366a, 366b arranged in the inner ring 358 by a distance of about 0.001 mm to about 1 mm. In some embodiments, each of the LED strings 360a and 360b may be electrically connected in series between the respective positive terminal 368, 369 and respective negative terminal (not shown, e.g., a ground terminal or a terminal with a reference potential different than the positive terminal). Alternatively, the LED strings 360a and 360b may be electrically connected in series between a respective positive terminal 368, 369 and a common terminal 370 as shown. Similarly, each of the LED strings 364a and 364b may be electrically connected in series between the respective positive terminal 372, 374 and respective negative terminal (not shown, e.g., a ground terminal or a terminal with a reference potential different than the positive terminal). Alternatively, the LED strings 364a and 364b may be electrically connected in series between a respective positive terminal 372, 374 and a common terminal 376 as shown.

Similar power management may be applied to the LED strings 362a,b and 366a,b. For example, each of the LED strings 362a and 362b may be electrically connected in series between the respective positive terminal 368, 369 and respective negative terminal (not shown, e.g., a ground terminal or a terminal with a reference potential different than the positive terminal). Alternatively, the LED strings 362a and 362b may be electrically connected in series between a respective positive terminal 368, 369 and a common terminal 378 as shown. Each of the LED strings 366a and 366b may be electrically connected in series between the respective positive terminal 372, 374 and respective negative terminal (not shown, e.g., a ground terminal or a terminal with a reference potential different than the positive terminal). Alternatively, the LED strings 366a and 366b may be electrically connected in series between a respective positive terminal 372, 374 and a common terminal 380 as shown.

While only eight LED strings are shown in FIG. 3B for clarity, it should be understood that few or more LED strings may be disposed inside the inner ring 358 and/or outside the outer ring 356. Any number of LED strings is contemplated. The number of the LEDs in each ring may vary along the radius of the concentric ring or the LED substrate 202. While equal irradiance is desired, in some embodiments the LED strings may have non-symmetric arrangement. For example, the LED strings may be missing in certain sections or have spacing increased in some regions to provide azimuthal irradiance of light. For thermal applications, higher irradiances may be required as the radius increases. There may be occasions where high flux UV (or optical) for chemical activation with or without heat is required. Occasional larger radial separation between segments may be necessary if the voltage increase is too large. In such a case, software control could be applied to avoid large voltage differences with reduced, but acceptable uniformity. In some embodiments, the combination of linear and circular arrangements of LED strings may be used for a desired irradiance profile. For example, one or more linear arrangements of LED strings may be disposed within the inner ring 358 and/or outside the outer ring 356 shown in FIG. 3B, or vise versa.

Figure 4:
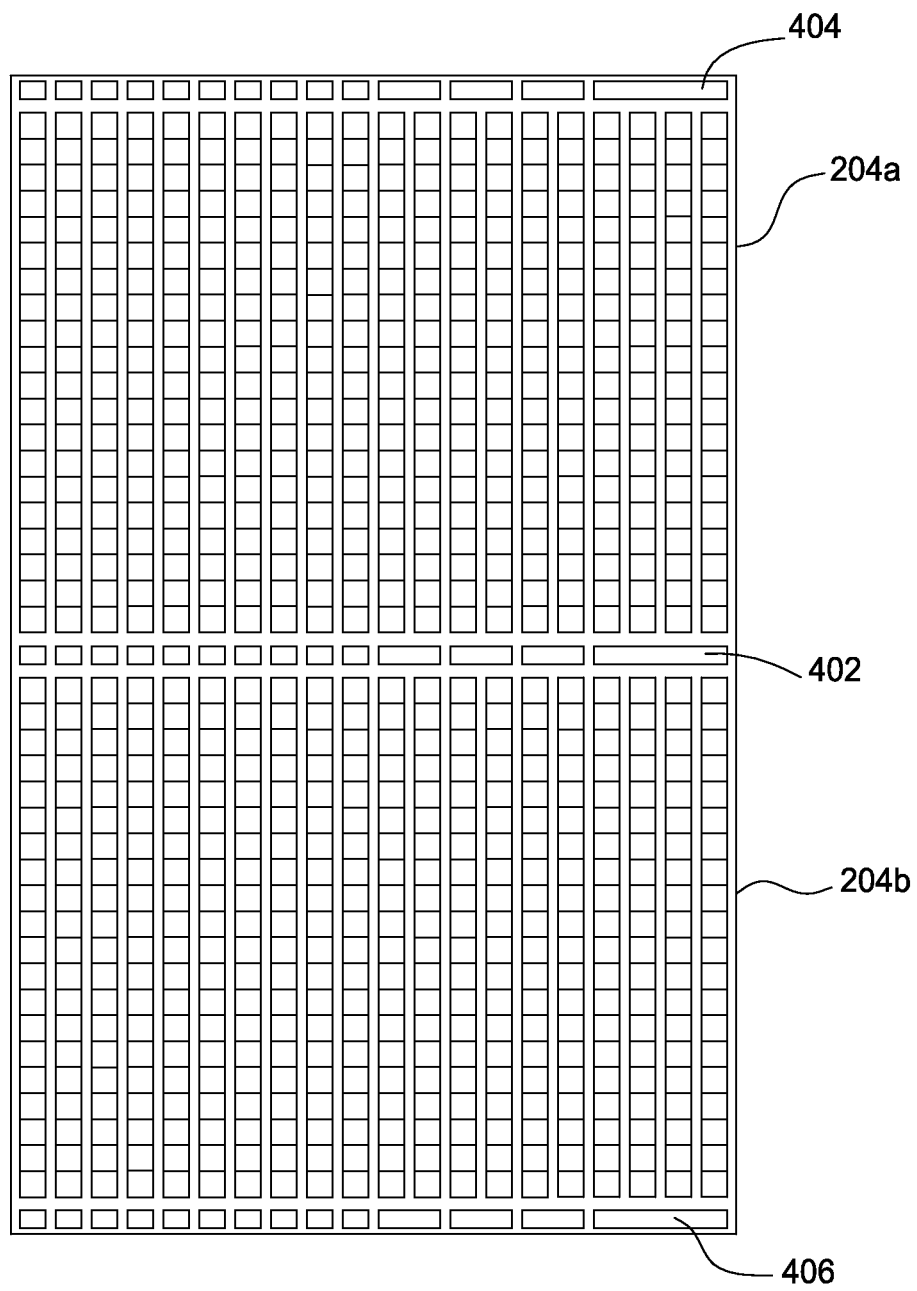
FIG. 4 is a schematic top view of the configuration LED arrays according to embodiments of the disclosure.

FIG. 4 is a schematic top view of the configuration LED arrays according to embodiments of the disclosure. In this embodiment, the configuration of the LED arrays 204a, 204b is substantially identical to FIGS. 2B and 3 as discussed above, except that two LED arrays 204a, 204b are configured to share a common negative (or ground) terminal 402. For example, one end of the first LED 206 in each LED string on the upper LED array 204a is attached to a first positive terminal 404, and the cathode electrode of each LED 206 in each LED string on the upper LED array 204a is electrically connected to the anode electrode of the LED 206 immediately following said LED 206 (e.g., R1 and R2). Accordingly, the last LED 206 in each LED string (beginning with the first positive terminal 404) has one end attaching to a common negative terminal 402.

Similarly, one end of the first LED 206 in each LED string on the lower LED array 204b is attached to the common negative terminal 402, and the cathode electrode of each LED 206 in each LED string on the lower LED array 204b is electrically connected to the anode electrode of the LED 206 immediately following said LED 206. Accordingly, the last LED 206 in each LED string (beginning with the common negative terminal 402) has one end attaching to a second positive terminal 406. With this arrangement, there would be zero voltage difference between any two immediately adjacent, parallel LED strings in each LED array 204a, 204b because each LED in any LED string is at the same voltage rating as its immediately adjacent LED (either on the right or left of said LED) in an adjacent LED string. With the common ground terminal shared by two adjacent LED arrays, the packing density of the LED arrays can be greatly increased and the electrical wiring simplified. LED arrays can be placed in a repeating pattern as shown in FIG. 4 for a very large area until the top surface (or packaging surface) of the LED substrate 202 is logically filled with a desired number of LEDs, such as the embodiment shown in FIG. 2A where nine LED arrays 204 are provided on the top surface of the LED substrate 202. It is contemplated that the number of the LED array 204 may vary depending upon the surface area of the LED substrate.

Figure 5:
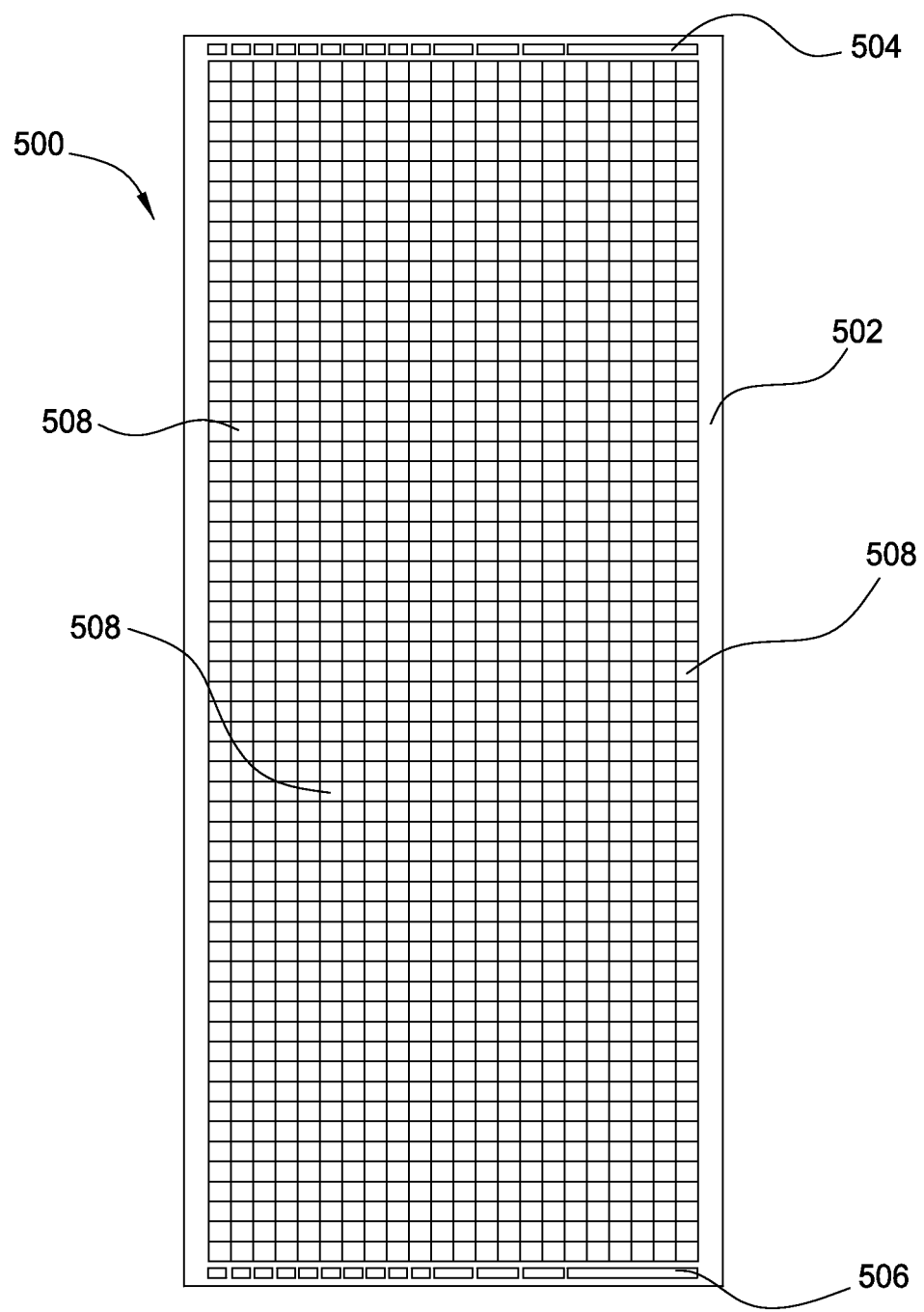
FIG. 5 is a schematic top view of an LED array according to embodiments of the disclosure.

FIG. 5 is a schematic top view of an LED array 500 according to one embodiment of the disclosure. The LED array 500 is an exemplary arrangement of an LED array and can be used in place of the LED array 204 shown in FIG. 2A, although the general configuration is substantially identical to those shown in FIGS. 2B, 3 and 4. The LED array shown in FIG. 5 has 22 LED strings of 60 LEDs electrically coupled in series for a total of 1320 LEDs formed on a top surface of an LED substrate 502, resulting in a rectangular-shaped panel of about 20 mm in width and about 53 mm in length. One or more LED strings within the LED array 500 are arranged in a straight line configuration and configured to electrically connect to their respective electrical contact pads, such as the positive terminal 504 and the negative terminal 506, arranged at a peripheral region of the LED array 500 on opposing sides of a diameter of the LED array 500. In one embodiment, each LED 508 may require about 3.2 volts or more for full intensity. The voltage required for full power is the number of LEDs in series times the voltage required, e.g., 60 times 3.2 V or about 192 volts in this example. Each LED string and the immediate adjacent LED string are parallel and separated from each other by a distance of about 0 mm to about 1 mm. The current required may be 7.7 amperes to deliver a total of 1478 watts of power to the LED array 500. The LEDs may be operated at a higher voltage to achieve higher intensity. The LED array 500 therefore uses a power density of about $7.47 \times 10^5$ W/m$^2$.

Embodiments of the present disclosure advantageously provide a solid state light source in a higher packing density to provide improved heating of substrates in a process chamber. By having LEDs in LED arrays (disposed on a LED substrate) arranged in parallel strings of straight lines, the LEDs can be packed as closely as possible with a minimum distance between the two adjacent LED strings powered at the same voltage without current leakage problems since there is zero voltage difference across two immediately adjacent LED strings. As a result, the LED arrays can be packed in a highest packing density possible on a LED substrate.

While the foregoing is directed to embodiments of the present disclosure, other and further embodiments of the disclosure may be devised without departing from the basic scope thereof.

The invention claimed is:

1. An apparatus for providing radiant energy to a process chamber, the apparatus comprising:
a supporting substrate;
a first plurality of solid state light sources disposed on a first surface of the supporting substrate; and
a second plurality of solid state light sources disposed on the first surface of the supporting substrate, wherein the first and second plurality of solid state light sources are aligned and each solid state light source in the first plurality of solid state light sources is not directly connected to any solid state light source in the second plurality of solid state light sources, and wherein voltage drop between a first solid state light source and a second solid state light source immediate adjacent the first solid state light source in the first plurality of solid state light sources and voltage drop between a third solid state light source and a fourth solid state light source immediate adjacent the third solid state light source in the second plurality of solid state light sources are equal, wherein the third and fourth solid state light sources are immediate adjacent the first and second solid state light sources, respectively.

2. The apparatus of claim 1, wherein each solid state light source in the first plurality of solid state light sources is electrically connected in series between a first contact and a second contact, and each solid state light source in the second plurality of solid state light sources is electrically connected in series between a third contact and a fourth contact, and wherein the first contact and the third contact have a first electric potential, and the second contact and the fourth contact have a second electric potential that is different from the first electric potential.

3. The apparatus of claim 2, wherein the first and second plurality of solid state light sources are arranged in multiple concentric rings of increasing diameter on the first surface of the supporting substrate.

4. The apparatus of claim 1, wherein the solid state light sources of the first and second plurality of solid state light sources are light emitting diodes (LEDs) or LASERs.

5. An apparatus for providing radiant energy to a process chamber, the apparatus comprising:
a supporting substrate;
a first plurality of solid state light sources disposed on a first surface of the supporting substrate; and
a second plurality of solid state light sources disposed on the first surface of the supporting substrate, wherein each solid state light source in the first plurality of solid state light sources is not directly connected to any solid state light source in the second plurality of solid state light sources, and voltage potential differences between each solid state light source in the first plurality of solid state light sources and the solid state light source in the second plurality of solid state light sources immediate adjacent each solid state light source in the first plurality of solid state light sources is less than an arcing potential, and the first and second plurality of solid state light sources are aligned and separated from each other by a minimum distance of 0 mm to about 1 mm.

6. The apparatus of claim 5, wherein each solid state light source in the first plurality of solid state light sources is electrically connected in series between a first contact and a second contact, and each solid state light source in the second plurality of solid state light sources is electrically connected in series between a third contact and a fourth contact, and wherein the first contact and the third contact are electrically connected.

7. The apparatus of claim 5, wherein each solid state light source in the first plurality of solid state light sources is electrically connected in series between a first contact and a second contact, and each solid state light source in the second plurality of solid state light sources is electrically connected in series between a third contact and a fourth contact, and wherein the first contact and the third contact are connected to a single electrical terminal.

8. The apparatus of claim 5, wherein each solid state light source in the first plurality of solid state light sources is electrically connected in series between a first contact and a second contact, and each solid state light source in the second plurality of solid state light sources is electrically connected in series between a third contact and a fourth contact, and wherein the second contact and the fourth contact have different electric potential.

9. The apparatus of claim 5, wherein each solid state light source in the first plurality of solid state light sources is electrically connected in series between a first contact and a second contact, and each solid state light source in the second plurality of solid state light sources is electrically connected in series between a third contact and a fourth contact, and wherein the second contact and the fourth contact are electrically connected.

10. The apparatus of claim 5, wherein each solid state light source in the first plurality of solid state light sources is electrically connected in series between a first contact and a second contact, and each solid state light source in the second plurality of solid state light sources is electrically connected in series between a third contact and a fourth contact, and wherein the second contact and the fourth contact are connected to a single electrical terminal.

11. The apparatus of claim 5, wherein each solid state light source in the first plurality of solid state light sources is electrically connected in series between a first contact and a second contact, and each solid state light source in the second plurality of solid state light sources is electrically connected in series between a third contact and a fourth contact, and wherein the first contact and the third contact are positioned at a peripheral region of the supporting substrate.

12. The apparatus of claim 11, wherein the first contact and the third contact are positioned on a second surface of the supporting substrate.

13. The apparatus of claim 12, wherein the first and second plurality of solid state light sources are in electrical communication with the first contact and the third contact, respectively, through a connection via formed through the supporting substrate.

14. The apparatus of claim 5, wherein the first and second plurality of solid state light sources are electrically connected in series by electrically conductive pads or wire bonds.

15. The apparatus of claim 5, wherein the solid state light sources of the first and second plurality of solid state light sources are light emitting diodes (LEDs) or LASERs.

16. The apparatus of claim 5, wherein each solid state light source in the first plurality of solid state light sources is electrically connected in series between a first contact and a second contact, and each solid state light source in the second plurality of solid state light sources is electrically connected in series between a third contact and a fourth contact, and wherein the first contact and the third contact have different electric potential.

17. An apparatus for providing energy to a process chamber, the apparatus comprising:
   a supporting substrate; and
   a plurality of strings of solid state light sources disposed parallel to each other on a first surface of the supporting substrate, wherein each string of solid state light sources is in a straight line configuration and has a plurality of light emitting elements electrically coupled in series, and voltage drops in each string of solid light sources and the immediate adjacent string of solid light sources are equal, and wherein each light emitting element in each string of solid light sources is not directly connected to any light emitting element in the immediate adjacent string of solid state light sources, and wherein each light emitting element in each string of solid state light sources has the same voltage rating as the immediate adjacent light emitting element in the immediate adjacent string of solid state light sources.

18. The apparatus of claim 17, wherein each light emitting element in each string of solid state light sources is electrically coupled in series between a first contact terminal and a second contact terminal that has an electric potential different from an electric potential of the first contact terminal.

19. The apparatus of claim 18, wherein the first contact terminal and the second contact terminal are positioned at a peripheral region of the supporting substrate.

20. The apparatus of claim 19, wherein the first contact terminal and the second contact terminal are positioned on a second surface of the supporting substrate, and each light emitting element in each string of solid state light sources is in electrical communication with the first contact terminal and the second contact terminal, respectively, through a connection via formed through the supporting substrate.

* * * * *